United States Patent
Arita et al.

(10) Patent No.: US 11,532,458 B2
(45) Date of Patent: Dec. 20, 2022

(54) ACTIVE GAS GENERATION APPARATUS

(71) Applicant: Toshiba Mitsubishi-Electric Industrial Systems Corporation, Tokyo (JP)

(72) Inventors: Ren Arita, Tokyo (JP); Kensuke Watanabe, Tokyo (JP); Shinichi Nishimura, Tokyo (JP)

(73) Assignee: TOSHIBA MITSUBISHI-ELECTRIC INDUSTRIAL SYSTEMS CORPORATION, Tokyo (JP)

( * ) Notice: Subject to any disclaimer, the term of this patent is extended or adjusted under 35 U.S.C. 154(b) by 97 days.

(21) Appl. No.: 17/045,762

(22) PCT Filed: May 30, 2018

(86) PCT No.: PCT/JP2018/020736
§ 371 (c)(1),
(2) Date: Oct. 7, 2020

(87) PCT Pub. No.: WO2019/229873
PCT Pub. Date: Dec. 5, 2019

(65) Prior Publication Data
US 2021/0057192 A1     Feb. 25, 2021

(51) Int. Cl.
*H01J 37/32*       (2006.01)

(52) U.S. Cl.
CPC .... *H01J 37/32348* (2013.01); *H01J 37/3255* (2013.01); *H01J 37/32357* (2013.01); *H01J 37/32541* (2013.01); *H01J 2237/327* (2013.01)

(58) Field of Classification Search
None
See application file for complete search history.

(56) References Cited

U.S. PATENT DOCUMENTS

| | | | | |
|---|---|---|---|---|
| 8,361,276 B2 * | 1/2013 | Selwyn | ............. | H01J 37/32596 156/345.43 |
| 9,006,972 B2 * | 4/2015 | Hopwood | ............. | C23C 16/545 315/39 |
| 9,288,886 B2 * | 3/2016 | Koo | ................... | H01J 37/32348 |
| 10,759,661 B2 * | 9/2020 | Murata | ................... | B01J 19/088 |
| 10,793,953 B2 * | 10/2020 | Watanabe | ........... | H05H 1/2406 |
| 10,840,065 B2 * | 11/2020 | Watanabe | ............. | H05H 1/466 |

(Continued)

FOREIGN PATENT DOCUMENTS

| | | |
|---|---|---|
| CN | 106797698 A | 5/2017 |
| JP | 2004-211161 A | 7/2004 |

(Continued)

OTHER PUBLICATIONS

International Search Report and Written Opinion dated Aug. 21, 2018 for PCT/JP2018/020736 filed on May 30, 2018, 9 pages including English Translation of the International Search Report.

(Continued)

*Primary Examiner* — Srinivas Sathiraju
(74) *Attorney, Agent, or Firm* — Xsensus LLP

(57) ABSTRACT

In the present invention, a high-voltage side electrode component further includes a conductive film disposed on an upper surface of a dielectric electrode independently of a metal electrode. The conductive film is disposed between at least one gas ejection port and the metal electrode in plan view, and the conductive film is set to ground potential.

3 Claims, 10 Drawing Sheets

(56) References Cited

U.S. PATENT DOCUMENTS

| | | | |
|---|---|---|---|
| 10,879,085 B2 * | 12/2020 | Tabata | H01L 21/67017 |
| 10,889,896 B2 * | 1/2021 | Nishimura | C01B 13/11 |
| 10,927,454 B2 * | 2/2021 | Nishimura | H01L 21/0217 |
| 10,971,338 B2 * | 4/2021 | Arita | H05H 1/2406 |
| 11,129,267 B2 * | 9/2021 | Watanabe | H01J 37/32541 |
| 11,239,059 B2 * | 2/2022 | Watanabe | C23C 14/0026 |
| 2004/0094411 A1 * | 5/2004 | Chistyakov | H01J 37/3476 204/298.14 |
| 2013/0240144 A1 * | 9/2013 | Buchberger | G05D 23/1393 165/100 |
| 2013/0260567 A1 * | 10/2013 | Marakhtanov | H01J 37/32091 156/345.44 |
| 2017/0241021 A1 * | 8/2017 | Tabata | H01J 37/32036 |
| 2018/0223433 A1 * | 8/2018 | Watanabe | H05H 1/2406 |
| 2020/0260565 A1 * | 8/2020 | Watanabe | H01J 37/32036 |
| 2020/0343078 A1 * | 10/2020 | Watanabe | B01J 19/088 |
| 2021/0057192 A1 * | 2/2021 | Arita | H01J 37/3255 |
| 2021/0296094 A1 * | 9/2021 | Creyghton | C23C 16/545 |
| 2022/0059322 A1 * | 2/2022 | Arita | H01J 37/32568 |

FOREIGN PATENT DOCUMENTS

| | | | | |
|---|---|---|---|---|
| JP | 2006-506521 A | 2/2006 | | |
| JP | 2006-303075 A | 11/2006 | | |
| JP | 2007-141583 A | 6/2007 | | |
| JP | 2009-205896 A | 9/2009 | | |
| JP | 2013-225672 A | 10/2013 | | |
| JP | 6239483 B2 | 11/2017 | | |
| KR | 10-2016-0063297 A | 6/2016 | | |
| KR | 2016063297 A * | 6/2016 | | A23B 4/14 |
| WO | 2015/019765 A1 | 2/2015 | | |
| WO | WO-2016013131 A1 * | 1/2016 | | C23C 16/50 |
| WO | 2017/159838 A1 | 9/2017 | | |
| WO | 2019/229873 A1 | 12/2019 | | |
| WO | WO-2019229873 A1 * | 12/2019 | | H01J 37/32348 |

OTHER PUBLICATIONS

International Search Report dated Jan. 28, 2020, in corresponding International Application PCT/JP2019/044356.
Office Action dated Jun. 22, 2022, in corresponding Chinese patent Application No. 201880093516.1, 19 pages.

* cited by examiner

F I G. 1
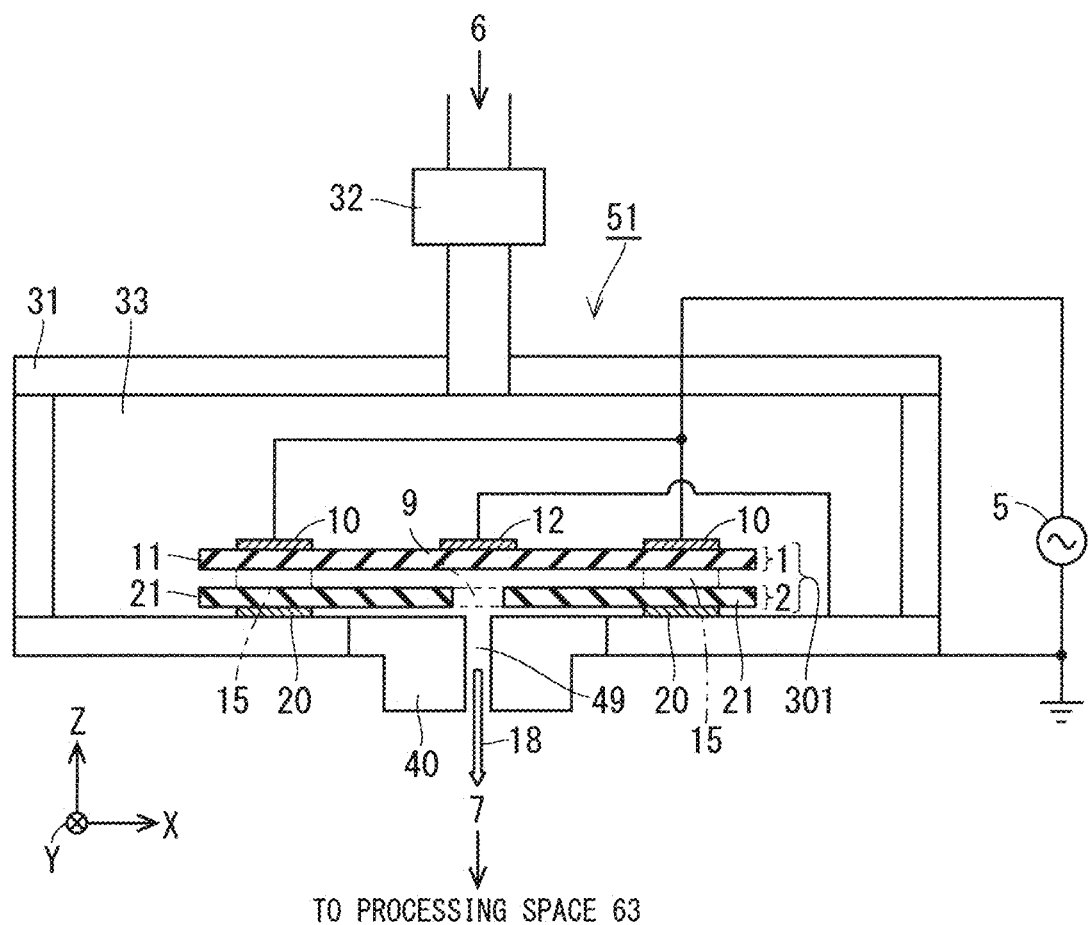
TO PROCESSING SPACE 63

ACTIVE GAS GENERATION APPARATUS

TECHNICAL FIELD

The present invention relates to an active gas generation apparatus generating active gas using a parallel-plate dielectric barrier discharge, and supplying the active gas to a downstream processing space.

BACKGROUND ART

An active gas generation apparatus generating active gas using a parallel-plate dielectric barrier discharge is disclosed, for example, in Patent Document 1.

FIG. 14 shows a schematic configuration of a conventional nitrogen radical generation system 100 disclosed in Patent Document 1. The nitrogen radical generation system 100 includes a nitrogen radical generation apparatus 101, an AC voltage source 108, and a processing chamber 112.

The nitrogen radical generation apparatus 101 as the active gas generation apparatus generates nitrogen radicals as the active gas from nitrogen gas using a dielectric barrier discharge.

A discharge unit generating the dielectric barrier discharge is disposed in a space 102 within the nitrogen radical generation apparatus 101. The above-mentioned discharge unit herein includes a first electrode 103 and a second electrode 104.

The second electrode 104 is installed in the center of a bottom surface of the nitrogen radical generation apparatus 101. The first electrode 103 is disposed to oppose the second electrode 104. The first electrode 103 and the second electrode 104 herein oppose to be spaced away from each other by a predetermined distance. That is to say, a discharge space 105 is formed between the first electrode 103 and the second electrode 104.

A dielectric (not illustrated in FIG. 14) is disposed on at least one of a main surface of the first electrode 103 facing the discharge space 105 and a main surface of the second electrode 104 facing the discharge space 105.

The above-mentioned discharge unit can generate the dielectric barrier discharge in the discharge space 105 between the first electrode 103 and the second electrode 104.

A gas supply inlet 106 is disposed in the center of an upper surface of the nitrogen radical generation apparatus 101. Nitrogen gas as source gas is suppled, through the gas supply inlet 106, from an exterior of the nitrogen radical generation apparatus 101 to the space 102 within the nitrogen radical generation apparatus 101.

One gas release part 107 to output nitrogen radical gas to the exterior of the nitrogen radical generation apparatus 101 is pierced in the center of the second electrode 104.

The AC voltage source 108 applies a high AC voltage to the above-mentioned discharge unit. One terminal of the AC voltage source 108 is electrically connected to the first electrode 103. The other terminal of the AC voltage source 108 is electrically connected to a housing of the nitrogen radical generation apparatus 101 (ground). As is evident from above, the second electrode 104 is disposed on the bottom surface of the nitrogen radical generation apparatus 101. The other terminal of the AC voltage source 108 is thus electrically connected to the second electrode 104 through the nitrogen radical generation apparatus 101.

That is to say, the AC voltage source 108 applies the high AC voltage across the first electrode 103 and the second electrode 104. By application of the AC voltage, the dielectric barrier discharge is generated in the discharge space 105 between the first electrode 103 and the second electrode 104.

Nitrogen gas supplied through the gas supply inlet 106 enters from an outer periphery of each of the electrodes 103 and 104 into the discharge space 105. Nitrogen gas is propagated from the outer periphery to the interior of each of the electrodes 103 and 104. By the dielectric barrier discharge generated in the discharge space 105, the nitrogen radical gas is generated from the nitrogen gas being propagated. The generated nitrogen radial gas is output through the gas release part 107 to the exterior of the nitrogen radical generation apparatus 101.

As illustrated in FIG. 14, the processing chamber 112 is disposed under the nitrogen radical generation apparatus 101. The bottom surface of the nitrogen radical generation apparatus 101 and an upper surface of the processing chamber 112 are herein in contact with each other.

An orifice part 109 is disposed between the nitrogen radical generation apparatus 101 and the processing chamber 112. The orifice part 109 connects the gas release part 107 and a processing room 111 within the processing chamber 112 through a pore 110.

The pore 110 of the orifice part 109 has a smaller diameter than a hole of the gas release part 107. More specifically, an entrance of the pore 110 of the orifice part 109 has a smaller diameter than an exit of the hole of the gas release part 107. A pressure section is thus formed by the pore 110 of the orifice part 109 between the space 102 within the nitrogen radical generation apparatus 101 and the processing room 111.

In the processing room 111 within the processing chamber 112, processing using nitrogen radicals generated by the nitrogen radical generation apparatus 101 and output from the nitrogen radical generation apparatus 101 (specifically, through the gas release part 107) is performed.

As illustrated in FIG. 14, a susceptor 114 is disposed in the processing room 11 within the processing chamber 112, and a wafer (substrate) 113 as a processing object is placed on the susceptor 114. A gas exhaust part 115 is disposed in a side surface of the processing chamber 112. The gas exhaust part 115 maintains pressure in the processing room 111 constant, for example, in a range of approximately 1 Torr to 100 Torr. Gas exhaust processing performed by the gas exhaust part 115 not only sets pressure in the space 102 and the processing room 111 but also generates a flow of nitrogen gas and nitrogen radical gas from the nitrogen radical generation apparatus 101 to the processing chamber 112.

As described above, the nitrogen radical generation apparatus 101 in the conventional nitrogen radical generation system 100 illustrated in FIG. 14 generates the dielectric barrier discharge in the discharge space 105 between the first electrode 103 and the second electrode 104, and supplies the active gas obtained by the dielectric barrier discharge, through the gas release part 107 and the pore 110 of the orifice part 109, to the processing room 111 of a downstream apparatus.

PRIOR ART DOCUMENT

Patent Document

Patent Document 1: Japanese Patent No. 6239483

SUMMARY

Problem to be Solved by the Invention

It is assumed in the conventional nitrogen radical generation apparatus 101 illustrated in FIG. 14 that, in a case where a constituent material of the orifice part 109 is an insulator, the voltage applied across the first electrode 103 and the second electrode 104 generates electric field strength causing dielectric breakdown on a surface of the orifice part 109 on a side of the processing room 111 to generate an abnormal discharge.

That is to say, the voltage applied to generate the dielectric barrier discharge also generates a region having electric field strength causing dielectric breakdown in the processing room 111 of the processing chamber 112 as the downstream apparatus to generate the abnormal discharge as a discharge that can cause metallic contamination in the processing room 111.

There has been a problem in that, as the processing room 111 is in a reduced pressure environment compared with the space 102 within the nitrogen radical generation apparatus 101, ions generated by the abnormal discharge are accelerated by an electric field and collide with the wafer 113 to damage the wafer 113.

Suppression of generation of the abnormal discharge is thus important in the conventional active gas generation apparatus. To suppress the abnormal discharge, it is necessary to mitigate the electric field strength in a region R107 near the gas release part 107.

As a method for suppressing the abnormal discharge, a first method of increasing the length of the pore 110 of the orifice part 109 is considered.

Use of the first method can provide a sufficient distance between a part, such as the first electrode 103, to which a high voltage is applied (hereinafter, also referred to as a "voltage applied part") and the downstream apparatus (processing chamber 112), and can thus reduce the electric field strength in the downstream apparatus.

The increase of the above-mentioned distance, however, increases time required for the active gas to reach the processing object (wafer 113), and thus increases the possibility that the active gas is deactivated. The increase of the above-mentioned distance is thus not desirable.

As another method for suppressing the abnormal discharge, a second method of reducing a value of the AC voltage supplied by the AC voltage source 108 or a similar method is considered. Use of the second method, however, leads to reduction in amount of generated active gas, and is thus not desirable.

As described above, the above-mentioned first and second methods have problems, and are not considered to be desirable as the method for suppressing the abnormal discharge.

It is an object of the present invention to provide an active gas generation apparatus capable of solving problems as described above, and intentionally reducing electric field strength in a processing space disposed below an orifice part without changing the structure of the orifice part.

Means to Solve the Problem

An active gas generation apparatus according to the present invention is an active gas generation apparatus generating active gas obtained by activating source gas supplied to a discharge space, and including: a first electrode component; and a second electrode component disposed below the first electrode component, wherein the first electrode component includes a first dielectric electrode and a first metal electrode disposed on an upper surface of the first dielectric electrode, the second electrode component includes a second dielectric electrode and a second metal electrode disposed on a lower surface of the second dielectric electrode, an AC voltage is applied across the first metal electrode and the second metal electrode, and, in a dielectric space in which the first dielectric electrode and the second dielectric electrode oppose each other, a region in which the first metal electrode and the second metal electrode overlap each other in plan view is included as the discharge space, the second dielectric electrode has at least one gas ejection port to externally jet the active gas, and a path from the discharge space to the at least one gas ejection port is defined as an active gas flow path, the active gas generation apparatus further includes an orifice part disposed in the second dielectric electrode itself or below the second dielectric electrode, and having at least one through hole corresponding to the at least one gas ejection port, the first electrode component further includes an auxiliary conductive film disposed on the upper surface of the first dielectric electrode independently of the first metal electrode, and the auxiliary conductive film is disposed to overlap a portion of the active gas flow path in plan view, and is set to ground potential.

Effects of the Invention

The active gas generation apparatus as the invention of the present application in claim 1 has the above-mentioned features, so that electric field strength on the above-mentioned active gas flow path can be mitigated by the auxiliary conductive film set to the ground potential.

As a result, the invention of the present application in claim 1 produces a main effect of intentionally reducing the electric field strength in the processing space disposed below the orifice part without changing the structure of the orifice part.

The objects, features, aspects, and advantages of the present invention will become more apparent from the following detailed description and the accompanying drawings.

BRIEF DESCRIPTION OF DRAWINGS

FIG. 1 illustrates a configuration of an active gas generation apparatus as an embodiment of the present invention.

DESCRIPTION OF EMBODIMENTS

Embodiment (Basic Configuration)

Figure 2:
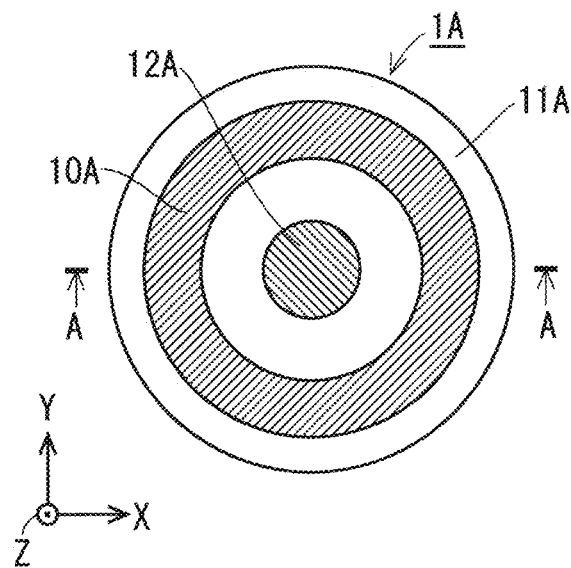
FIG. 2 is a top plan view of a high-voltage side electrode component in a first aspect.

FIG. 1 illustrates a basic configuration of an active gas generation apparatus as an embodiment of the present invention. An XYZ Cartesian coordinate system is shown in FIG. 1. An active gas generation apparatus 51 of the present embodiment is an active gas generation apparatus generating active gas 7 obtained by activating source gas 6 supplied to a discharge space 15.

The active gas generation apparatus 51 includes, as main components, a metal housing 31, a gas supply inlet 32, an active gas generation electrode group 301, and an orifice part 40.

The metal housing 31 is a housing for the active gas generation apparatus 51 set to ground potential and made of metal, and the gas supply inlet 32 is attached to the top of the metal housing 31 so that the source gas 6 is supplied through the gas supply inlet 32 to an internal space 33 of the metal housing 31.

The active gas generation electrode group 301 is disposed in the internal space 33 of the metal housing 31 of the active gas generation apparatus 51. Specifically, the active gas generation electrode group 301 is disposed on a bottom surface of the metal housing 31. The orifice part 40 is incorporated into a portion of the bottom surface of the metal housing 31.

The active gas generation electrode group 301 includes a combination of a high-voltage side electrode component 1 as a first electrode component and a ground side electrode component 2 as a second electrode component, and the ground side electrode component 2 is disposed below the high-voltage side electrode component 1.

The high-voltage side electrode component 1 includes, as main components, a dielectric electrode 11 as a first dielectric electrode and a metal electrode 10 as a first metal electrode disposed on an upper surface of the dielectric electrode 11. The high-voltage side electrode component 1 further includes a conductive film 12 as an auxiliary conductive film disposed on the upper surface of the dielectric electrode 11 independently of the metal electrode 10.

The conductive film 12 made of metal is disposed between at least one gas ejection port 9 and the metal electrode 10 made of metal in plan view. The conductive film 12 made of metal may overlap the at least one gas ejection port 9 in plan view.

The metal electrode 10 and the conductive film 12 are disposed on the upper surface of the dielectric electrode 11, for example, using sputtering and printed firing.

The ground side electrode component 2 includes, as main components, a dielectric electrode 21 as a second dielectric electrode and a metal electrode 20 as a second metal electrode disposed on a lower surface of the dielectric electrode 21.

The metal electrode 20 is disposed on the lower surface of the dielectric electrode 21 using sputtering, printed firing, and the like.

The dielectric electrode 11 of the high-voltage side electrode component 1 and the dielectric electrode 21 of the ground side electrode component 2 are installed to be spaced away from each other by a predetermined constant distance by a spacer and the like, which are not illustrated.

An AC voltage is applied by a high-frequency power supply 5 across the metal electrode 10 and the metal electrode 20. Specifically, the AC voltage is applied to the metal electrode 10 by the high-frequency power supply 5, and the metal electrode 20 and the conductive film 12 are set to the ground potential through the metal housing 31.

In a dielectric space in which the dielectric electrode 11 and the dielectric electrode 21 oppose each other, the discharge space 15 is provided to include a region in which the metal electrodes 10 and 20 overlap each other in plan view.

The upper surface of the dielectric electrode 11 and the lower surface of the dielectric electrode 21 each may be flush, or may have a predetermined shape. For example, the upper surface of the dielectric electrode 11 may have irregularity to be an obstacle not to generate a creeping discharge between the metal electrode 10 and the conductive film 12.

The dielectric electrode 21 has the at least one gas ejection port 9 to jet the active gas 7 to an external processing space 63.

The orifice part 40 is disposed below the dielectric electrode 21, and has at least one through hole 49 corresponding to the at least one gas ejection port 9. A constituent material of the orifice part 40 is one of ceramic, glass, and sapphire.

In the active gas generation apparatus 51 having such a configuration, the AC voltage is applied across the metal electrodes 10 and 20 to generate the dielectric barrier discharge in the discharge space 15 of the active gas generation electrode group 301, and, at the same time, the source gas 6 is supplied to the internal space 33 of the metal housing 31 through the gas supply inlet 32 to distribute (flow) the source gas 6 from the outer periphery to the interior of the active gas generation electrode group 301.

The active gas 7 is thus generated in the active gas generation apparatus 51 through activation of the source gas 6 in the discharge space 15, and the generated active gas 7 flows through an active gas flow path from the discharge space 15 to the at least one gas ejection port 9 in the above-mentioned dielectric space.

The active gas 7 flowing through the above-mentioned active gas flow path is eventually supplied, through the at least one gas ejection port 9 and the through hole 49 of the orifice part 40, to the processing space 63 provided downstream along a gas flow 18.

In the active gas generation apparatus 51 of the present embodiment, the conductive film 12 is disposed to overlap a portion of the above-mentioned active gas flow path in plan view as described above.

As described above, the active gas generation apparatus 51 of the present embodiment has the following features (1) and (2):

(1) the conductive film 12 is disposed to overlap a portion of the above-mentioned active gas flow path in plan view; and (2) the conductive film 12 is set to ground potential.

As specific configurations to achieve the basic configuration of the active gas generation apparatus 51 of the embodiment illustrated in FIG. 1, a first aspect and a second aspect described below are considered.

(First Aspect)

FIGS. 2 to 5 each illustrate a structure of an active gas generation electrode group 301A in the first aspect of the active gas generation apparatus 51 of the embodiment. The XYZ Cartesian coordinate system is shown in each of FIGS. 2 to 5.

In the first aspect of the active gas generation apparatus 51, the active gas generation electrode group 301A illustrated in each of FIGS. 2 to 5 is used as the active gas generation electrode group 301 of the basic configuration illustrated in FIG. 1.

Figure 3:
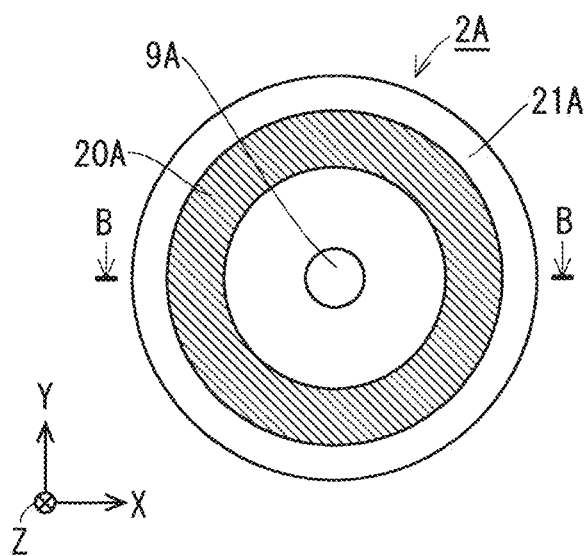
FIG. 3 is a bottom plan view of a ground side electrode component in the first aspect.
Figure 4:
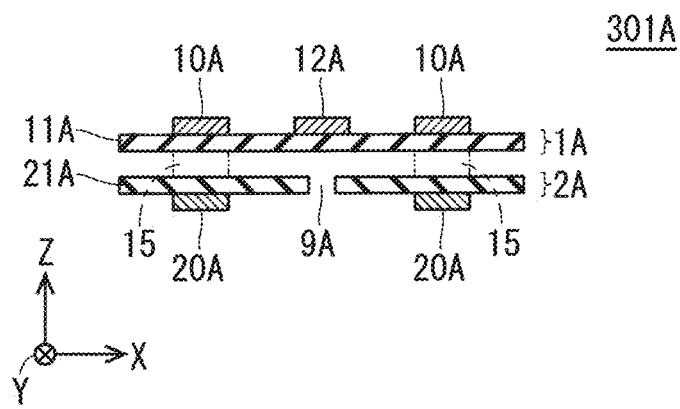
FIG. 4 is a sectional view showing a cross-sectional structure of an active gas generation electrode group in the first aspect.
Figure 5:
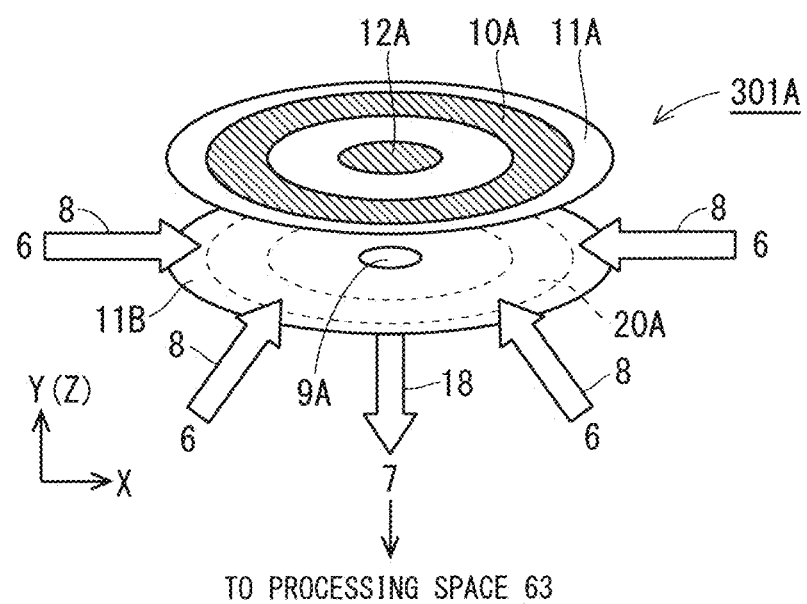
FIG. 5 schematically shows an overall configuration of the active gas generation electrode group in the first aspect.

FIG. 2 is a top plan view (from a +Z direction) of a high-voltage side electrode component 1A in the first aspect. FIG. 3 is a bottom plan view (from a −Z direction) of a ground side electrode component 2A in the first aspect. FIG. 4 is a sectional view showing a cross-sectional structure taken along an XZ plane of the active gas generation electrode group 301A. FIG. 5 schematically shows an overall configuration of the active gas generation electrode group 301A.

The active gas generation electrode group 301A in the first aspect will be described below by referring to FIGS. 2 to 5 as appropriate.

As illustrated in FIGS. 4 and 5, the active gas generation electrode group 301A includes a combination of the high-voltage side electrode component 1A as the first electrode component and the ground side electrode component 2A as the second electrode component. The ground side electrode component 2A is disposed below the high-voltage side electrode component 1A. As illustrated in FIG. 2 to 5, the active gas generation electrode group 301A has a parallel-plate structure.

The high-voltage side electrode component 1A includes, as main components, a dielectric electrode 11A as the first dielectric electrode and a metal electrode 10A as the first metal electrode disposed on an upper surface of the dielectric electrode 11A. The high-voltage side electrode component 1A further includes a conductive film 12A as the auxiliary conductive film disposed on the upper surface of the dielectric electrode 11A independently of the metal electrode 10A.

As illustrated in FIG. 2, the dielectric electrode 11A is circular in plan view, the metal electrode 10A is annular in plan view, and the conductive film 12A is circular in plan view. The conductive film 12A is disposed on a central portion of the dielectric electrode 11A to overlap a gas ejection port 9A in plan view. The metal electrode 10A is disposed around the conductive film 12A to be separated from an outer periphery of the conductive film 12A by a predetermined distance. The cross-sectional structure shown in FIG. 4 is taken along the line A-A of FIG. 2.

On the other hand, the ground side electrode component 2A includes, as main components, a dielectric electrode 21A as the second dielectric electrode and a metal electrode 20A as the second metal electrode disposed on a lower surface of the dielectric electrode 21A.

The dielectric electrode 21A has a single gas ejection port 9A to jet the active gas 7 to the external processing space 63. The single gas ejection port 9A corresponds to the at least one gas ejection port 9 of the basic configuration illustrated in FIG. 1.

As illustrated in FIG. 3, the dielectric electrode 21A is circular in plan view, the metal electrode 20A is annular in plan view, and the single gas ejection port 9A is circular in plan view. The gas ejection port 9A is provided in a central portion of the dielectric electrode 21A in plan view. The metal electrode 20A is disposed around the gas ejection port 9A to be separated from an outer periphery of the gas ejection port 9A by a predetermined distance. The cross-sectional structure shown in FIG. 4 is taken along the line B-B of FIG. 3.

In the first aspect having the above-mentioned configuration, a path from the discharge space 15 to the single gas ejection port 9A in a dielectric space formed between the dielectric electrodes 11A and 21A is defined as the active gas flow path.

As illustrated in FIGS. 2 to 5, the conductive film 12A is located to overlap the gas ejection port 9A in plan view. That is to say, the conductive film 12A is disposed to overlap a portion of the above-mentioned active gas flow path in plan view.

An AC voltage is applied by the high-frequency power supply 5 across the metal electrode 10A and the metal electrode 20A. Specifically, the AC voltage is applied to the metal electrode 10A by the high-frequency power supply 5, and the metal electrode 20A and the conductive film 12A are set to the ground potential through the metal housing 31.

The orifice part 40 in the first aspect is disposed below the dielectric electrode 21A, and has a single through hole 49 corresponding to the single gas ejection port 9A.

As described above, the first aspect of the active gas generation apparatus 51 is characterized in that the conductive film 12A is disposed to overlap a portion of the above-mentioned active gas flow path in plan view, and the conductive film 12A is set to the ground potential. That is to say, the first aspect has the above-mentioned features (1) and (2) of the basic configuration.

In the first aspect of the active gas generation apparatus 51 having such a configuration, the AC voltage is applied across the metal electrodes 10A and 20A to generate the dielectric barrier discharge in the discharge space 15 of the active gas generation electrode group 301A. Furthermore, in the first aspect of the active gas generation apparatus 51, the source gas 6 is supplied to the internal space 33 of the metal housing 31 through the gas supply inlet 32 to distribute the source gas 6 in a direction from the outer periphery of the active gas generation electrode group 301A to the single gas ejection port 9A as a gas flow 8 (see FIG. 5).

The active gas 7 is thus generated in the first aspect of the active gas generation apparatus 51 through activation of the source gas 6 in the discharge space 15, and the generated active gas 7 flows through the active gas flow path from the discharge space 15 to the single gas ejection port 9A in the above-mentioned dielectric space.

The active gas 7 flowing through the above-mentioned active gas flow path is eventually supplied, through the single gas ejection port 9A and the through hole 49 of the orifice part 40, to the processing space 63 provided downstream along the gas flow 18.

(Second Aspect)

FIGS. 6 to 9 each illustrate a structure of an active gas generation electrode group 301B in the second aspect of the active gas generation apparatus 51 of the embodiment. The XYZ Cartesian coordinate system is shown in each of FIGS. 6 to 9.

In the second aspect of the active gas generation apparatus 51, the active gas generation electrode group 301B illustrated in each of FIGS. 6 to 9 is used as the active gas generation electrode group 301 of the basic configuration illustrated in FIG. 1.

Figure 6:
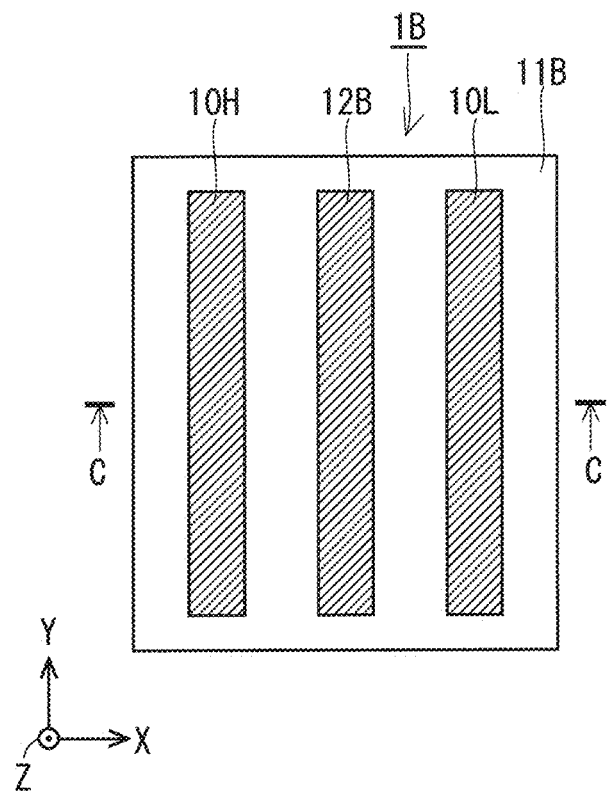
FIG. 6 is a top plan view of a high-voltage side electrode component in a second aspect.
Figure 7:
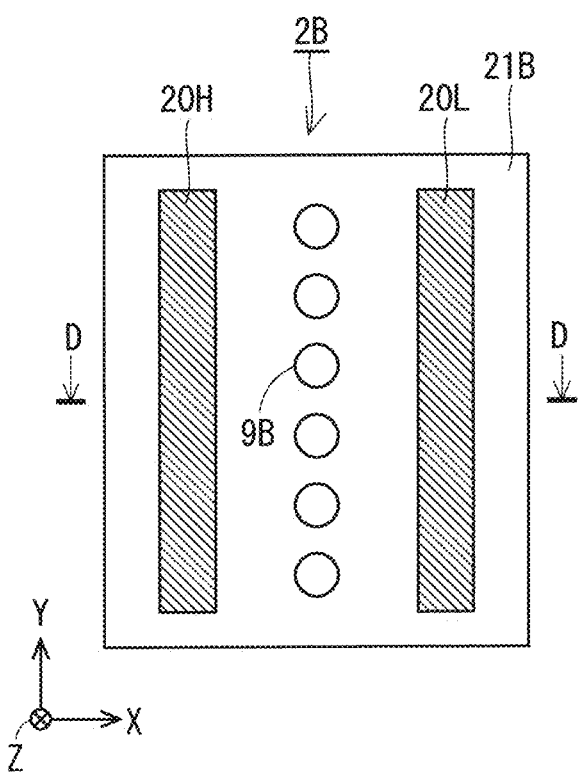
FIG. 7 is a bottom plan view of a ground side electrode component in the second aspect.
Figure 8:
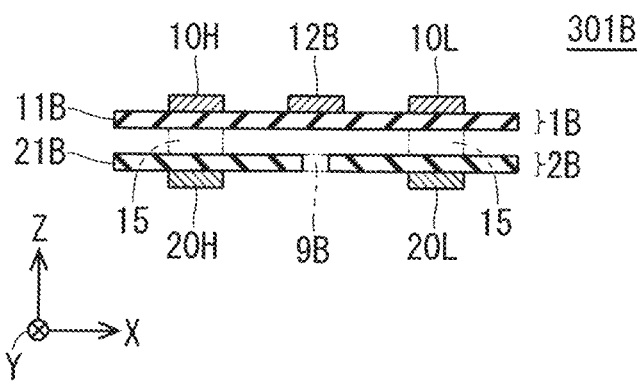
FIG. 8 is a sectional view showing a cross-sectional structure of an active gas generation electrode group in the second aspect.
Figure 9:
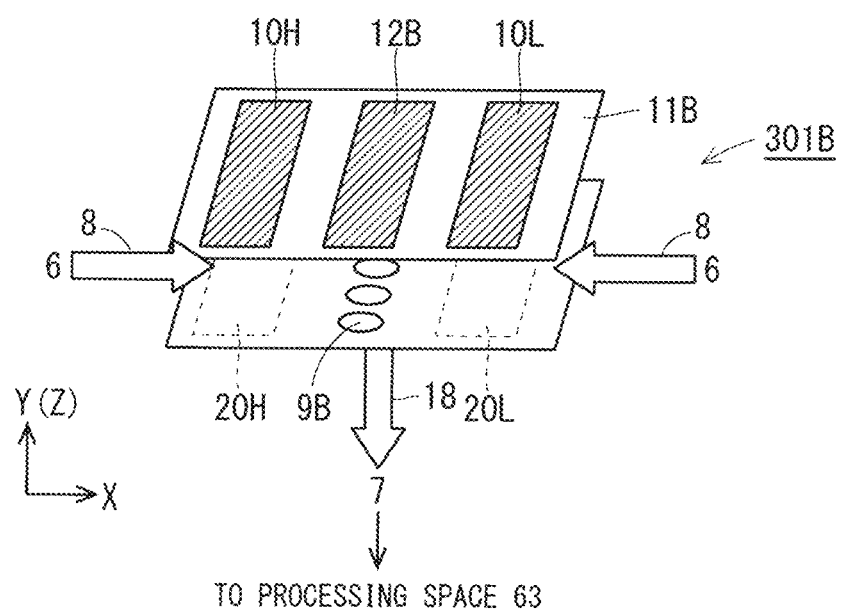
FIG. 9 schematically shows an overall configuration of the active gas generation electrode group in the second aspect.

FIG. 6 is a top plan view (from the +Z direction) of a high-voltage side electrode component 1B in the second aspect. FIG. 7 is a bottom plan view (from the −Z direction) of a ground side electrode component 2B in the second aspect. FIG. 8 is a sectional view showing a cross-sectional structure taken along the XZ plane of the active gas generation electrode group 301B. FIG. 9 schematically shows an overall configuration of the active gas generation electrode group 301B.

The active gas generation electrode group 301B in the second aspect will be described below by referring to FIGS. 6 to 9 as appropriate.

As illustrated in FIGS. 8 and 9, the active gas generation electrode group 301B includes a combination of the high-voltage side electrode component 1B as the first electrode component and the ground side electrode component 2B as the second electrode component. The ground side electrode component 2B is disposed below the high-voltage side electrode component 1B. As illustrated in FIG. 6 to 9, the active gas generation electrode group 301B has a parallel-plate structure.

The high-voltage side electrode component 1B includes, as main components, a dielectric electrode 11B as the first dielectric electrode and a pair of metal electrodes 10H and 10L as the first metal electrode disposed on an upper surface of the dielectric electrode 11B. The high-voltage side electrode component 1B further includes a conductive film 12B as the auxiliary conductive film disposed on the upper surface of the dielectric electrode 11B independently of the pair of metal electrodes 10H and 10L.

As illustrated in FIG. 6, the dielectric electrode 11B is rectangular to have a longer side in a Y direction in plan view, the metal electrodes 10H and 10L as the pair are each rectangular to have a longer side in the Y direction in plan view, and the conductive film 12B is rectangular to have a longer side in the Y direction in plan view. The conductive film 12B is disposed on a middle portion in an X direction of the dielectric electrode 11B in plan view.

The metal electrodes 10H and 10L as the pair are disposed to sandwich the conductive film 12B and to be separated from the conductive film 12B by a predetermined distance. That is to say, the metal electrode 10H is disposed to the left (in a −X direction) of the conductive film 12B, and the metal electrode 10L is disposed to the right (in a +X direction) of the conductive film 12B. The cross-sectional structure shown in FIG. 8 is taken along the line C-C of FIG. 6.

On the other hand, the ground side electrode component 2B includes, as main components, a dielectric electrode 21B as the second dielectric electrode and a pair of metal electrodes 20H and 20L as the second metal electrode disposed on a lower surface of the dielectric electrode 21B.

The dielectric electrode 21B has a plurality of gas ejection ports 9B to jet the active gas 7 to the external processing space 63. The plurality of gas ejection ports 9B correspond to the at least one gas ejection port 9 of the basic configuration illustrated in FIG. 1.

As illustrated in FIG. 7, the dielectric electrode 21B is rectangular to have a longer side in the Y direction in plan view, the metal electrodes 20H and 20L as the pair are each rectangular to have a longer side in the Y direction in plan view, and the plurality of gas ejection ports 9B are each circular in plan view.

The plurality of gas ejection ports 9B are provided discretely along the Y direction in the dielectric electrode 21B. The plurality of gas ejection ports 9B are each located in the middle in the X direction of the dielectric electrode 21B.

The metal electrodes 20H and 20L as the pair are disposed to sandwich the plurality of gas ejection ports 9B and to be separated by a predetermined distance. The metal electrode 20H is disposed to the left (in the −X direction) of the plurality of gas ejection ports 9B, and the metal electrode 20L is disposed to the right (in the +X direction) of the plurality of gas ejection ports 9B. The cross-sectional structure shown in FIG. 8 is taken along the line D-D of FIG. 7.

In the second aspect having the above-mentioned configuration, a path from the discharge space 15 to the plurality of gas ejection ports 9B in a dielectric space formed between the dielectric electrodes 11B and 21B is defined as the active gas flow path.

As illustrated in FIGS. 6 to 9, the conductive film 12B is located to overlap the plurality of gas ejection ports 9B in plan view. That is to say, the conductive film 12B is disposed to overlap a portion of the above-mentioned active gas flow path in plan view.

An AC voltage is applied by the high-frequency power supply 5 across the metal electrodes 10H and 10L as the pair and across the metal electrodes 20H and 20L as the pair. Specifically, the AC voltage is applied to the metal electrodes 10H and 10L as the pair by the high-frequency power supply 5, and the metal electrodes 20H and 20L as the pair and the conductive film 12B are set to the ground potential through the metal housing 31.

The orifice part 40 in the second aspect is disposed below the dielectric electrode 21B, and has a plurality of through holes 49 corresponding to the plurality of gas ejection ports 9B.

As described above, the second aspect of the active gas generation apparatus 51 is characterized in that the conductive film 12B is disposed to overlap a portion of the above-mentioned active gas flow path in plan view, and the conductive film 12B is set to the ground potential. That is to say, the second aspect has the above-mentioned features (1) and (2) of the basic configuration.

In the second aspect of the active gas generation apparatus 51 having such a configuration, the AC voltage is applied across the metal electrodes 10H and 10L as the pair and across the metal electrodes 20H and 20L as the pair to generate the dielectric barrier discharge in the discharge space 15 of the active gas generation electrode group 301B. Furthermore, in the second aspect of the active gas generation apparatus 51, the source gas 6 is supplied to the internal space 33 of the metal housing 31 through the gas supply inlet 32 to distribute the source gas 6 from opposite ends of the active gas generation electrode group 301B in the X direction to the interior along a gas flow 8 (see FIG. 9) parallel to the X direction.

The active gas 7 is thus generated in the second aspect of the active gas generation apparatus 51 through activation of the source gas 6 in the discharge space 15, and the generated active gas 7 flows through the active gas flow path from the discharge space 15 to the plurality of gas ejection ports 9B in the above-mentioned dielectric space.

The active gas 7 flowing through the above-mentioned active gas flow path is eventually supplied, through the plurality of gas ejection ports 9B and the plurality of through holes 49 of the orifice part 40, to the processing space 63 provided downstream along the gas flow 18.

(Results of Simulation)

Figure 10:
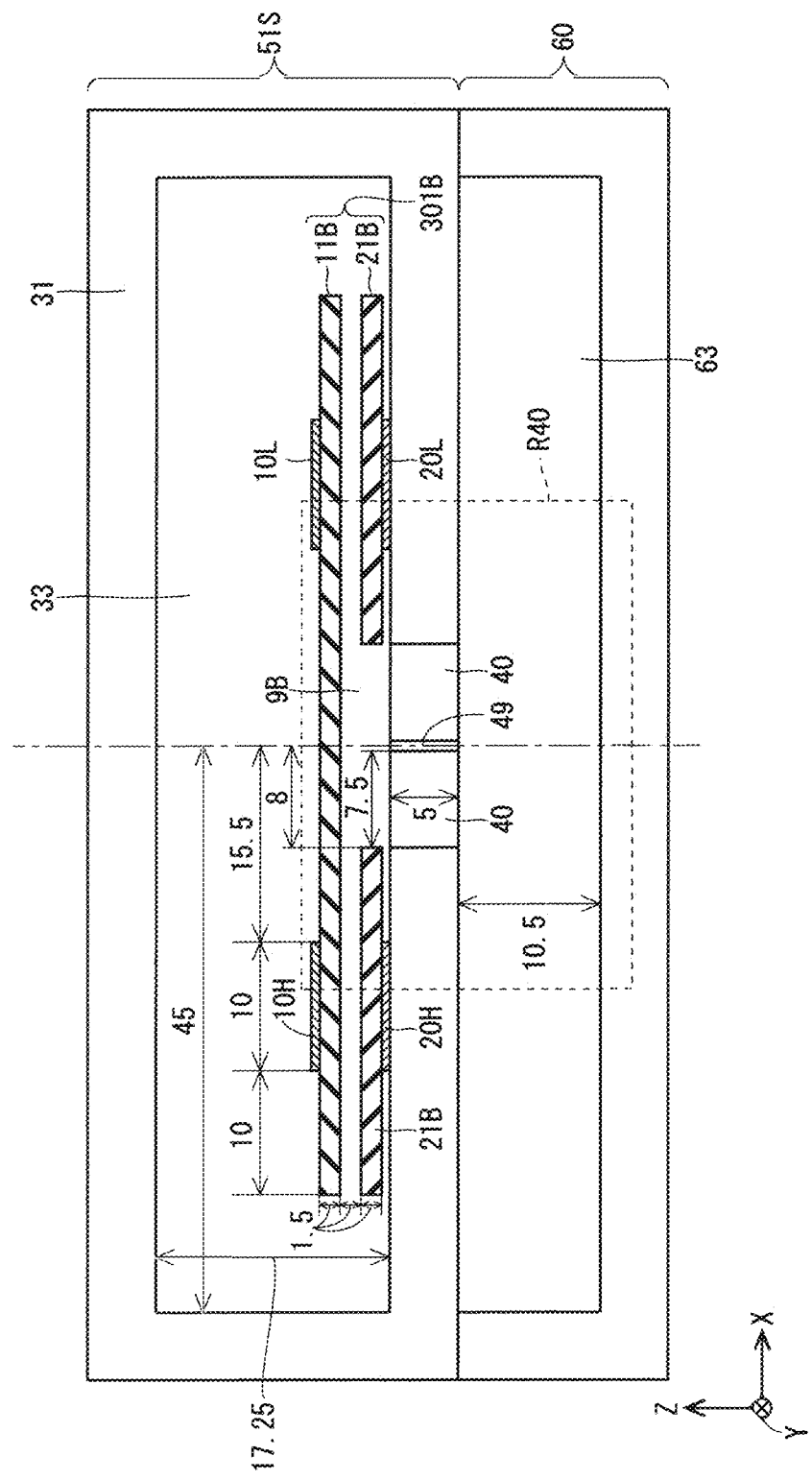
FIG. 10 schematically shows a structure of a target of simulation.
Figure 11:
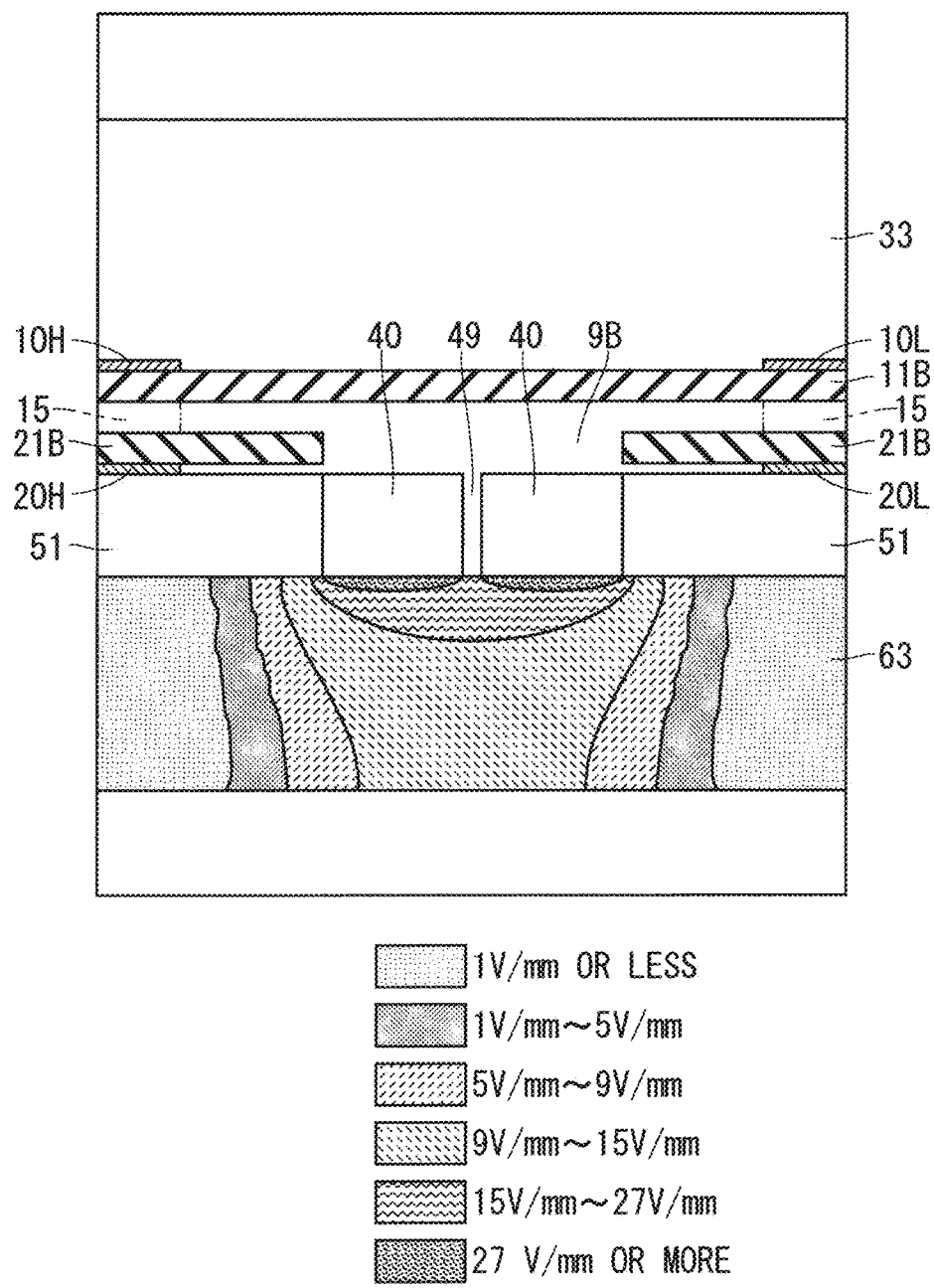
FIG. 11 illustrates a result of simulation of a conventional structure.
Figure 12:
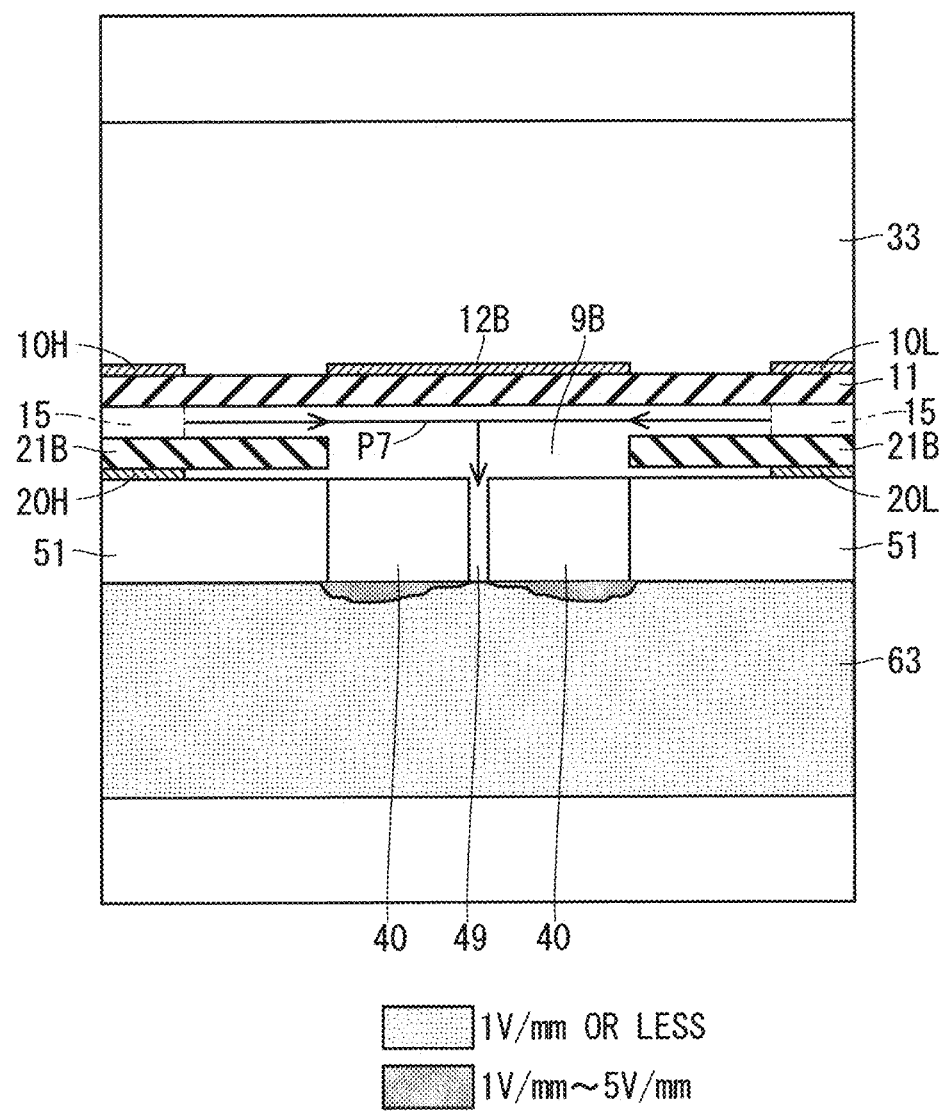
FIG. 12 illustrates a result of simulation of the present embodiment.
Figure 13:
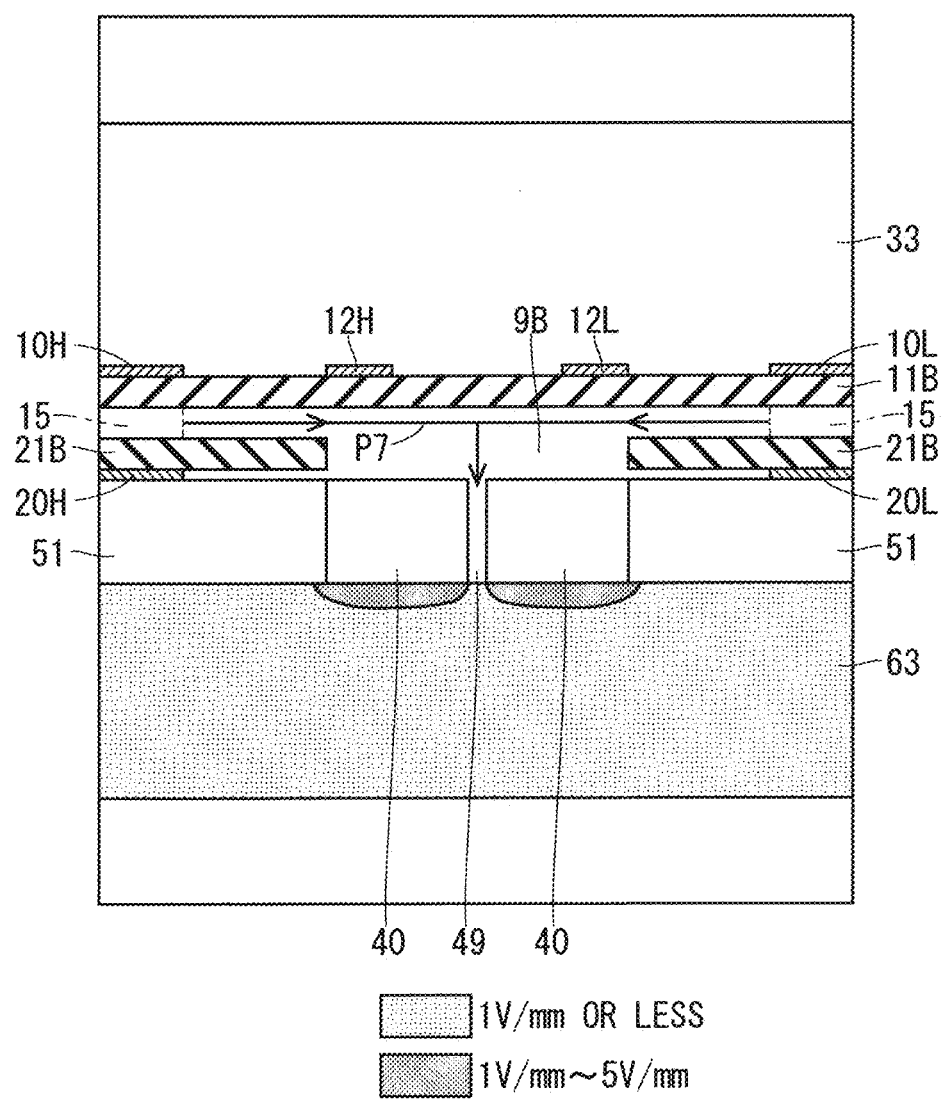
FIG. 13 illustrates a result of simulation of a modification of the present embodiment.
Figure 14:
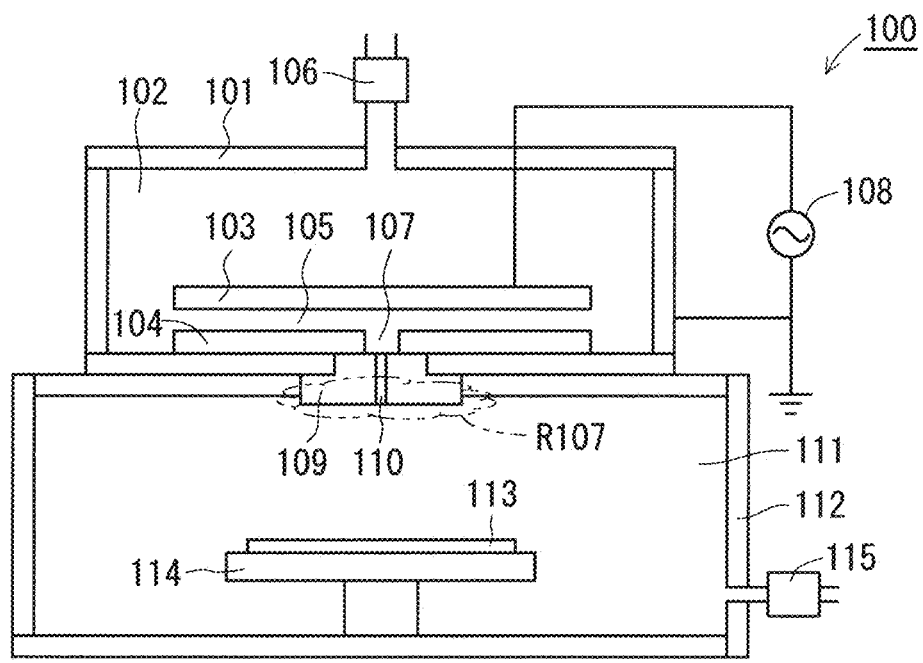
FIG. 14 shows a schematic configuration of a conventional nitrogen radical generation system.

FIG. 10 schematically shows a structure of a target of simulation. The XYZ Cartesian coordinate system is shown in FIG. 10. FIG. 11 illustrates a result of simulation of a conventional structure not having the conductive film 12 (12A and 12B). FIG. 12 illustrates a result of simulation of the basic configuration (the second aspect) of the present embodiment. FIG. 13 illustrates a result of simulation of a modification of the present embodiment.

The structure shown in FIG. 10 is a combined structure of an active gas generation apparatus 51S as the target of simulation and a processing chamber 60. The active gas generation apparatus 51S has a similar configuration to the active gas generation apparatus 51 of the basic configuration illustrated in FIG. 1, and the second aspect illustrated in FIGS. 6 to 9 is used from among the first and second aspects. The conductive film 12B and the gas exhaust part of the processing chamber 60 are not illustrated in FIG. 10.

The active gas generation apparatus 51S has dimensional properties described below. The internal space 33 has a height of 17.25 mm, has a width in the X direction of 90 (45+45) mm, and has a distance from the center in the X direction of 45 mm.

The dielectric electrodes 11B and 21B each have a film thickness of 1.5 mm, and have a length of a gap in the discharge space 15 of 1.5 mm, the gas ejection ports 9B each have a radius of 8 mm, and the through holes 49 each have a radius of 0.5 (8-7.5) mm, and have a length of 5 mm.

The metal electrodes 10H and 10L as the pair each have a width in the X direction of 10 mm, a distance from the center to each of the metal electrodes 10H and 10L as the pair in the X direction is 15.5 mm, and distances from respective ends of the dielectric electrode 11B to the metal electrodes 10H and 10L as the pair in the X direction are each 10 mm. The processing space 63 of the processing chamber 60 has a height of 10.5 mm.

FIGS. 11 to 13 are each an enlarged view of a region of interest R40 of FIG. 10, and the region of interest R40 has a cross-sectional structure of the active gas generation electrode group 301B and the orifice part 40 near each of the gas ejection ports 9B.

A dielectric material of each of the dielectric electrode 11B of the high-voltage side electrode component 1B and the dielectric electrode 21B of the ground side electrode component 2B is simulated to have relative permittivity of "10", and metal electrodes 10H and 10L as the pair are simulated to receive a voltage of 6000 V.

The metal housing 31 and a housing of the processing chamber 60 are simulated to be made of metal, and have a ground potential of "0" V.

Since a target of evaluation of the electric field strength is the processing space 63 of the processing chamber 60, the electric field strength in the processing space 63 below the orifice part 40 is visualized in each of FIGS. 11 to 13.

FIG. 11 illustrates a result of simulation of an active gas generation apparatus having a conventional structure in which the high-voltage side electrode component 1B does not include the conductive film 12B for setting to the ground potential.

As illustrated in FIG. 11, there is a region in which the electric field strength of the orifice part 40 facing the processing space 63 provided downstream of the active gas generation apparatus exceeds 27 V/mm, and a region in which the electric field strength is 5 V/mm or more accounts for at least half of the processing space 63 as the target of evaluation.

FIG. 12 illustrates a structure in the second aspect of the embodiment in which the high-voltage side electrode component 1B includes the conductive film 12B, and the conductive film 12B is disposed to overlap a portion of an active gas flow path P7 in plan view.

As illustrated in FIG. 12, in the second aspect of the active gas generation apparatus 51, the electric field strength of the orifice part facing the processing space 63 is high but is 5 V/mm or less, and an effect produced by the conductive film 12B of mitigating the electric field strength in the processing space 63 compared with the conventional structure illustrated in FIG. 11 has been confirmed.

FIG. 13 illustrates a structure of a modification in which the high-voltage side electrode component 1B includes two conductive films 12B installed separately from each other.

In the modification, the conductive film 12B is separated into two conductive films 12H and 12L, and the conductive film 12H is disposed on a side of the metal electrode 10H and the conductive film 12L is disposed on a side of the metal electrode 10L.

The conductive films 12H and 12L are disposed to sandwich the plurality of gas ejection ports 9B in plan view. The conductive films 12H and 12L are each rectangular in plan view as with the conductive film 12B illustrated in each of FIGS. 6 to 9.

In the modification, the conductive films 12H and 12L are each disposed to overlap a portion of the active gas flow path P7 in plan view, and the conductive films 12H and 12L are set to the ground potential.

As illustrated in FIG. 13, in the modification, the effect produced by the conductive films 12H and 12L of mitigating the electric field strength in the processing space 63 compared with the conventional structure illustrated in FIG. 11 has been confirmed. In the modification, however, a region in which the electric field strength is 1 to 5 V/mm increases compared with the basic configuration (second aspect) of the embodiment illustrated in FIG. 12.

The results of simulation illustrated in FIGS. 10 to 13 have revealed that the electric field strength in the processing space 63 is mitigated by including the conductive film 12 (12B) set to the ground potential in the high-voltage side electrode component 1 (1B), and disposing the conductive film 12 so that the conductive film 12 overlaps a portion of the above-mentioned active gas flow path in plan view.

The magnitude of the applied voltage and the size and the like of the metal electrode 10 (10H and 10L) and the like in the above-mentioned simulation are examples, and the magnitude of the electric field strength in the downstream processing space 63 changes depending on the magnitude of the applied voltage and the size and a method of disposing the metal electrode 10.

However, the effect of mitigating the electric field strength in the downstream processing space 63 can be produced by having the above-mentioned features (1) and (2) of the embodiment of the present invention.

(Effects)

As described above, the active gas generation apparatus 51 of the present embodiment has the following features (1) and (2):

(1) the conductive film 12 (12A and 12B) is disposed to overlap a portion of the above-mentioned active gas flow path in plan view; and (2) the conductive film 12 is set to the ground potential.

The active gas generation apparatus 51 of the present embodiment has the above-mentioned features (1) and (2), so that the conductive film 12 as the auxiliary conductive film set to the ground potential can mitigate the electric field strength on the above-mentioned active gas flow path.

As a result, the active gas generation apparatus 51 of the present embodiment produces a main effect of intentionally reducing the electric field strength in the processing space 63 provided below the orifice part 40 without changing the structure of the orifice part. Furthermore, with the above-mentioned main effect, first to fourth secondary effects described below can be produced.

The first secondary effect: generation of the abnormal discharge in the processing space 63 can be suppressed, metallic contamination in the processing space 63 can be suppressed, and damage on the processing object, such as the wafer, in the processing space 63 can be reduced.

The second secondary effect: the metal electrodes 10 and 20 can be disposed so that an active gas flow distance from the discharge space 15 to the at least one gas ejection port 9 is reduced.

As a result, the active gas generation apparatus 51 of the present embodiment can efficiently supply the active gas 7 to the processing space 63 without increasing the electric field strength in the processing space 63. Furthermore, the active gas generation apparatus 51 can be reduced in size by reduction of the above-mentioned active gas flow distance.

As a method of reducing the above-mentioned active gas flow distance, a configuration in which an inner periphery of each of the metal electrodes 10A and 20A is closer to the center is considered in the first aspect (FIGS. 2 to 5). In the second aspect (FIGS. 6 to 9), a configuration in which the metal electrodes 10H and 10L as the pair and the metal electrodes 20H and 20L as the pair are disposed closer to the middle in the X direction is considered.

The third secondary effect: at least one through hole 49 of the orifice part can be reduced in length.

As a result, the active gas generation apparatus 51 of the present embodiment can efficiently supply the active gas 7 to the processing space 63 without increasing the electric field strength in the processing space 63. Furthermore, the active gas generation apparatus 51 can be reduced in size by reduction in length of the at least one through hole 49.

The fourth secondary effect: a higher AC voltage can be applied. As a result, the active gas generation apparatus 51 of the present embodiment can efficiently supply the active gas 7 having a large capacity to the processing space 63 without increasing the electric field strength in the processing space 63.

Furthermore, in the active gas generation apparatus 51 of the present embodiment, the constituent material of the orifice part 40 is at least one of ceramic, glass, and sapphire.

Since the constituent material of the orifice part 40 is at least one of ceramic, glass, and sapphire each having resistance to corrosion, reaction with the active gas 7 is reduced, and deactivation of the active gas 7 can be suppressed. As a result, the active gas generation apparatus 51 of the present embodiment can supply the active gas 7 having a higher concentration to the processing space 63 below the orifice part 40. In place of sapphire, any other solid crystal not having conductivity but having resistance to corrosion may be used.

The source gas 6 used in the active gas generation apparatus 51 of the present embodiment is desirably gas containing at least one of hydrogen, nitrogen, oxygen, fluorine, and chlorine gas.

By using the above-mentioned gas as the source gas, the active gas generation apparatus 51 of the present embodiment can perform film formation processing of forming a nitride film, an oxide film, and the like, generation of etching gas and washing gas, and surface modification processing.

This point will be described in details below. By using nitrogen and oxygen as the source gas 6, the nitride film and the oxide film as a dielectric film can be formed. By using fluorine and chlorine gas as the source gas 6, activated fluorinated gas and chlorine gas can be used as the etching gas and the washing gas. By using hydrogen and nitrogen as the source gas 6, surface modification processing can be performed by hydrogenating and nitriding a surface of a predetermined object, such as a substrate, using activated hydrogen gas and nitriding gas.

<Others>

In the basic configuration of the active gas generation apparatus 51 illustrated in FIG. 1, the orifice part 40 and the dielectric electrode 21 of the ground side electrode component 2 are separately formed, but the orifice part 40 and the dielectric electrode 21 may integrally be formed. For example, the at least one gas ejection port 9 of the dielectric electrode 21 may be formed to have a sufficiently small diameter as each of the through holes 49 of the orifice part 40.

In this case, the at least one gas ejection port 9 of the dielectric electrode 21 serves as at least one through hole of the orifice part, and the dielectric electrode 21 itself functions as the orifice part. As described above, the active gas generation apparatus 51 may be modified to provide the orifice part to the dielectric electrode 21 itself.

As the specific configurations to achieve the basic configuration of the active gas generation apparatus 51 of the embodiment illustrated in FIG. 1, the first aspect (FIGS. 2 to 5) and the second aspect (FIGS. 6 to 9) are shown. A configuration other than the first and second aspects is applicable on condition that the configuration has the above-mentioned features (1) and (2) of the basic configuration.

While the invention has been described in detail, the foregoing description is in all aspects illustrative and not restrictive. It is therefore understood that numerous modifications not having been described can be devised without departing from the scope of the invention.

The invention claimed is:

1. An active gas generation apparatus generating active gas obtained by activating source gas supplied to a discharge space, said active gas generation apparatus comprising:
   a first electrode component; and
   a second electrode component disposed below said first electrode component, wherein
   said first electrode component includes a first dielectric electrode and a first metal electrode disposed on an upper surface of said first dielectric electrode, said second electrode component includes a second dielectric electrode and a second metal electrode disposed on a lower surface of said second dielectric electrode, an AC voltage is applied across said first metal electrode and said second metal electrode, and, in a dielectric space in which said first dielectric electrode and said second dielectric electrode oppose each other, a region in which said first metal electrode and said second metal electrode overlap each other in plan view is included as said discharge space,
   said second dielectric electrode has at least one gas ejection port to externally jet said active gas, and a path from said discharge space to said at least one gas ejection port is defined as an active gas flow path,
   said active gas generation apparatus further includes
      an orifice part disposed in said second dielectric electrode itself or below said second dielectric electrode, and having at least one through hole
   corresponding to said at least one gas ejection port,
   said first electrode component further includes
      an auxiliary conductive film disposed on said upper surface of said first dielectric electrode independently of said first metal electrode, said auxiliary conductive film and said first metal electrode are disposed by a predetermined distance, and
   said auxiliary conductive film is disposed to overlap a portion of said active gas flow path in plan view, and is set to ground potential.

2. The active gas generation apparatus according to claim 1, wherein
   a constituent material of said orifice part includes at least one of ceramic, glass, and sapphire.

3. The active gas generation apparatus according to claim 1, wherein
said source gas is gas containing at least one of hydrogen, nitrogen, oxygen, fluorine, and chlorine gas.

* * * * *